United States Patent [19]

Syria

[11] 3,947,702
[45] Mar. 30, 1976

[54] FREQUENCY DOUBLING CIRCUIT FOR AUTOMOTIVE CONTROL SYSTEM

[75] Inventor: Ronald L. Syria, Utica, Mich.

[73] Assignee: Borg-Warner Corporation, Chicago, Ill.

[22] Filed: Oct. 18, 1974

[21] Appl. No.: 516,309

[52] U.S. Cl. .................. 307/271; 307/246; 307/260
[51] Int. Cl.² ......................................... H03K 17/00
[58] Field of Search ........... 307/273, 293, 271, 246, 307/254, 255, 229, 260; 324/166; 328/209, 140

[56] References Cited
UNITED STATES PATENTS

| | | | |
|---|---|---|---|
| 3,348,143 | 10/1967 | Young | 324/126 |
| 3,651,345 | 3/1972 | Lundgreen | 307/273 |
| 3,727,082 | 4/1973 | Coding | 307/273 |
| 3,846,647 | 1/1974 | Tanimoto | 307/273 |

*Primary Examiner*—Stanley D. Miller, Jr.
*Assistant Examiner*—B. P. Davis
*Attorney, Agent, or Firm*—James J. Jennings

[57] ABSTRACT

An automotive control system utilizes a pulse-generating circuit driven as a function of wheel angular velocity to produce electrical signals related to vehicle wheel rotation. The signals are shaped, filtered and passed to associated equipment, such as regulated braking circuits, to perform the regulating function. The frequency doubling circuit is provided to accommodate different sensing systems which produce fewer output signals for a given angular displacement of a vehicle wheel.

3 Claims, 2 Drawing Figures

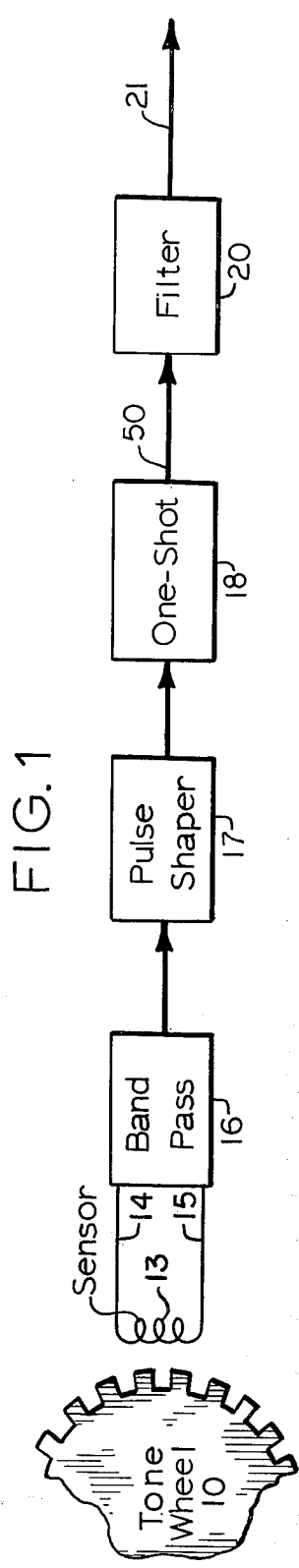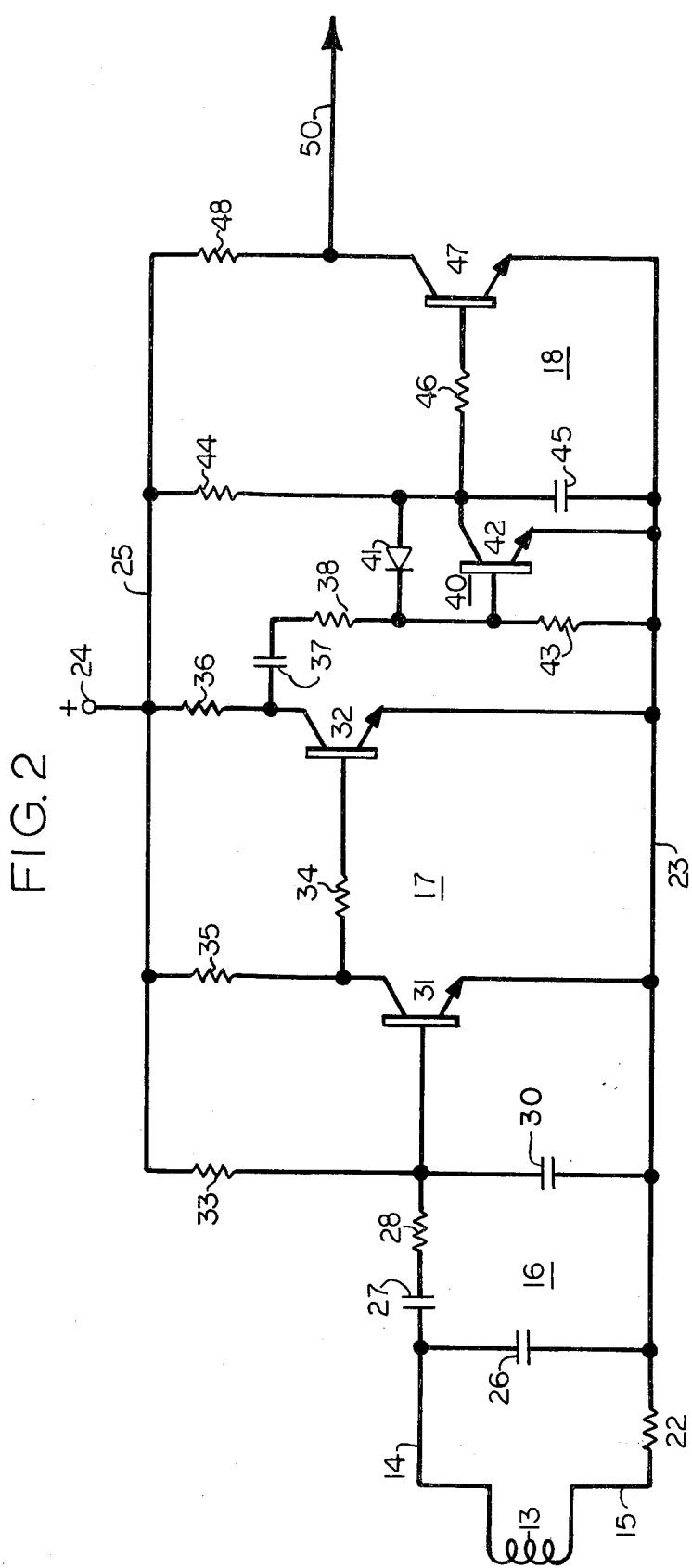

3,947,702

FREQUENCY DOUBLING CIRCUIT FOR AUTOMOTIVE CONTROL SYSTEM

BACKGROUND OF THE INVENTION

Various control systems now utilized in passenger cars require input information related to vehicle velocity and/or wheel angular velocity. Controlled braking systems generally require a signal related to wheel angular velocity to avoid wheel lockup and consequent skidding. This signal has been provided by utilizing a "tone wheel", a slotted disc driven as a function of wheel rotation, and an inductive sensor positioned adjacent the tone wheel to provide frequency-indicating output signals which vary in frequency as a function of the vehicle wheel angular velocity. Of course other types of sensors, such as a light-emitting unit which has its radiation alternately blocked and passed by apertures in a driven disc, and a radiation-sensitive sensor or pickup unit, can also be used in a place of a tone wheel and inductive sensor. Some control circuits were developed for use with a tone wheel having 120 teeth, thus providing 120 cycles of the output signal for each complete revolution of the tone wheel. Some automotive manufacturers desired to utilize tone wheels with only 60 teeth, which necessitated major redesign of the band pass and other circuits in the existing control systems. This would entail considerable expense and time, and it is clearly desirable to obviate such expense and time, if possible.

It is therefore a primary consideration of this invention to provide an automotive vehicle control circuit suitable for use with tone wheels having 60 teeth and providing output information at a rate corresponding to that of systems employing 120 tooth tone wheels.

SUMMARY OF THE INVENTION

The present invention is useful in an automotive vehicle having electronic circuitry employing a-c information signals of a frequency related to the angular velocity of a vehicle wheel. The pulse generating circuit of the invention includes a sensor which is positioned to provide frequency-indicating output signals which vary in frequency as the vehicle wheel angular velocity varies. A differentiating circuit is connected to operate on the frequency-indicating signals, to produce both a positive-going signal and a negative-going signal during each complete cycle of the sensor output signal. A one-shot multivibrator circuit includes a capacitor for regulating generation of a rectangular output pulse. In particular, a semiconductor switch and a diode are connected to effect discharge of the capacitor during both the positive-going and negative-going portions of each cycle of the sensor output signal, to effect frequency doubling in the control system.

THE DRAWING

In the drawing like reference numerals identify like components, and in the drawing:

FIG. 1 is a block diagram of a known angular velocity detecting system; and

FIG. 2 is a schematic diagram, illustrating circuit details of some components shown in FIG. 1, together with the frequency doubling circuit of this invention.

GENERAL SYSTEM DESCRIPTION

FIG. 1 depicts a segment of a tone wheel 10, connected (over a conventional arrangement not illustrated) to be driven as a function of the angular velocity of a vehicle wheel. The tone wheel 10 includes a plurality of teeth 11 separated by gaps 12. Inductive sensor 13 is positioned adjacent the tone wheel so that rotation of the tone wheel provides a frequency-indicating signal across winding 13, which signal is then applied over conductors 14, 15 to a band pass filter circuit 16. In general, the band pass circuit is tuned or conditioned electrically, in cooperation with the inductance value of sensor 13, to pass signals within a desired frequency range and to attenuate stray noise and spurious signals outside the desired frequency range. Band pass circuit 16 passes the output signals to a pulse shaper circuit 17, which in turn provides trigger signals to a one-shot multivibrator circuit 18 which establishes constant-duration signals for use in an associated control system. These signals in turn are passed over a line 50 to filter circuit 20 and then over an output line 21 for use in related circuitry, such as the controlled braking arrangement referred to above. These general circuits, together with the physical mounting of the tone wheel and sensor, are now known and understood in this art and need not be further described here.

DETAILED DESCRIPTION OF THE INVENTION

The details of the present invention, and associated circuitry, are set out in FIG. 2. As there shown, inductive sensor 13 has its opposite ends coupled to conductors 14, 15. A protective resistor 22 is connected between line 15 and reference conductor 23. A suitable energizing potential must be applied to terminal 24, shown connected to the energizing conductor 25, to energize the illustrated circuit.

Input or band pass circuit 16 includes capacitors 26, 27 and a resistor 28 connected as illustrated between the sensor and input capacitor 30 of the pulse shaping circuit. Pulse shaper circuit 17 includes a pair of semiconductor switches, shown as NPN type transistors 31 and 32, each having a collector, base and emitter connection, which are also described as output, input and common connections. The emitters of transistors 31 and 32 are connected to reference conductor 23. The base or input connection of transistor 31 is coupled to one side of capacitor 30, to one side of resistor 28, and over resistor 33 to energizing conductor 25. The collector of transistor 31 is connected to both the resistors 34 and 35; resistor 35 has its other side connected to energizing conductor 25. Resistor 34 completes the signal path between the collector of transistor 31 and the base of transistor 32. The collector of transistor 32 is coupled over a resistor 36 to energizing conductor 25, and the same collector is also coupled to capacitor 37 in the differentiating circuit, which differentiating circuit also includes resistors 38 and 43. In general the differentiating circuit 37, 38, 43 is considered a part of the pulse-shaping circuitry.

In accordance with the present invention, a frequency doubling circuit 40 is provided. This circuit includes a diode 41, and another semiconductor switch shown as an NPN type transistor 42. Resistor 43 in the differentiating circuit also functions as a leakage resistor in the frequency doubling circuit. The cathode of diode 41 and the base of transistor 42 are both coupled to the common connection between resistors 38 and 43, and the other side of resistor 43 is connected to reference conductor 23. The emitter of transistor 42 is also connected to the reference conductor. The anode of diode 41 and the collector of transistor 42 are both connected to a common connection in the one-shot multivibrator circuit 18, between resistor 44 and capacitor 45. The series circuit 44, 45 is connected between the energizing and reference conductors 25, 23. The one-shot circuit also includes a resistor 46, having one end coupled to the common connection between components 44 and 45, and its other end coupled to the base of another NPN type transistor 47, the emitter of which is connected to reference conductor 23. The collector of transistor 47 is coupled over a resistor 48 to energizing conductor 25, and the collector is also coupled to an output conductor 50 for providing the frequency-doubled signal to a filter 20 or any other suitable system for utilizing the wheel angular velocity information.

In operation, as tone wheel 10 is rotated, the frequency-indicating output signal from sensor 13 is produced. Because sensor 13 is inductive in the illustrated embodiment, the frequency-indicating signal is generally sinusiodal. With other arrangements, such as a lamp (not shown) passing light through slits in a tone wheel to strike a light-sensitive transistor, the resultant frequency-indicating signal is generally rectangular. With either arrangement, the frequency-indicating signal is passed through band pass filter 16 to the base of transistor 31. This signal is amplified in transistors 31, 32 and appears at the collector of transistor 32. The frequency-indicating signal is differentiated across circuit 37, 38, 43 to provide a positive-going pulse as the frequency-indicating signal begins to go positive, and a negative-going pulse when the negative-going portion of the frequency-indicating signal is begun. Capacitor 45 in the one-shot circuit is normally charged, and transistor 47 is normally conducting; in this steady-state condition the output signal on line 50 is low. The charge on capacitor 45 is maintained over resistor 44 from the positive energizing conductor 25.

As the positive-going portion of the frequency-indicating signal appears at the collector of transistor 32, a positive-going signal is provided by differentiator 37, 38, 43 and this positive spike drives on transistor 42, which effectively discharges capacitor 45. This discharge removes the drive from the base of transistor 47 and turns it off, allowing the potential at its collector to go high, providing a positive-going output signal on line 50. After the positive-going spike disappears from the base of transistor 42, it is again non-conductive, and capacitor 45 begins to recharge over resistor 44. At a time determined by the RC time constant of 44, 45, transistor 47 is again gated on, driving its collector potential low and terminating the output pulse on line 50. Thus the duration of this rectangular pulse on line 50 is a function of the circuit constants, and not of the frequency of rotation of the tone wheel 10.

When the negative portion of the frequency-indicating signal begins, a negative-going spike is provided over resistors 38, 43 and diode 41 becomes conductive. Thus capacitor 45 is again discharged and transistor 47 becomes non-conducting to provide another rectangular output pulse on line 50. This operation of the circuit provides the frequency-doubled pulses over line 50 to the associated equipment.

TECHNICAL ADVANTAGES

The frequency-doubling circuit of the invention has several unobvious and important advantages over known arrangement which provide a "brute-force" or straightforward frequency doubling. For example, one skilled in the art might provide a full-wave rectifier bridge between sensor 13 and the band pass circuit, to provide effective frequency doubling as the frequency-indicating signal is rectified. However the forward voltage drops to cause the diodes to conduct provide a significant limitation on the system. In general circuits such as that shown in FIG. 2 are designed to operate at a very low power level, even lower than those which cause the diodes to conduct. Thus at low speeds of the auto, the diodes in such a rectifier bridge would not conduct, and in effect the wheel angular velocity signal would be lost. If a transformer is added to the input circuit to enhance the sensor output signal, this adds to the bulk and expense of the circuit. In addition the rectifier bridge and transformer combination would provide a mismatch between the sensor and the band pass circuit 16, changing the frequency response characteristics of the circuit and necessitating major redesign.

It is also noted that most straightforward doubling arrangements would simply employ another diode instead of transistor 42 coupled in parallel with diode 41, with the other diode connected to conduct in the opposite direction. However, such an arrangement would be ineffective as it would tend to charge capacitor 45 on the positive-going spikes provided by the differentiator, rather than discharge the capacitor as required for operation of the one-shot multivibrator circuit.

At this time it is believed that the best mode for practicing the invention includes using a circuit such as that shown in FIG. 2.

In the appended claims the term "connected" means a d-c connection between two components with virtually zero d-c resistance between those components. The term "coupled" indicates there is a functional relationship between two components, with the possible interposition of other elements between the two components described as "coupled" or "intercoupled."

While only a particular embodiment of the invention has been described and claimed herein, it is apparent that various modifications and alterations of the invention may be made. It is therefore the intention in the appended claims to cover all such modifications and alterations as may fall within the true spirit and scope of the invention.

What is claimed is:

1. For use in an automotive vehicle having electronic circuitry utilizing a-c information signals occurring at a frequency related to the angular velocity of a vehicle wheel, a pulse-generating circuit comprising:

a sensor, positioned to provide frequency-indicating output signals varying in frequency as a function of variations in the angular velocity of the vehicle wheel;

a differentiating circuit, connected to receive the frequency-indicating output signals and to produce both a positive-going signal and a negative-going signal during each complete cycle of the sensor output signal;

a one-shot multivibrator circuit, including a first semiconductor switch having input, output and common connections and connected to be normally conducting, a capacitor coupled between the input and common connections of the first semiconductor switch such that upon discharge of said capacitor the switch is rendered non-conductive to generate a rectangular wave output pulse during the non-conductive period of the first semiconductor switch, and a resistor coupled to the capacitor to provide a path for charging the capacitor after each discharge to regulate the time duration of the rectangular wave output pulse from the one-shot circuit;

diode, having its anode coupled to the capacitor in the one-shot circuit and its cathode coupled to the differentiating circuit; and second semiconductor switch, having input, output and common connections and having its output-common path coupled in parallel with said capacitor, and having its input connection coupled to the same point of the differentiating circuit as is the cathode of the diode, to complete a discharge path for said capacitor upon receipt of each positive-going signal from the differentiating circuit.

2. A pulse-generating circuit as claimed in claim 1, and further comprising a filter circuit coupled to the output side of the one-shot multivibrator circuit, to provide a d-c analog signal which varies in amplitude in accordance with the variation in frequency of the equal-duration pulses produced by the one-shot circuit.

3. A pulse-generating circuit as claimed in claim 1, in which the sensor is an inductive sensor which produces generally sinusoidal output signals, and further comprising a band-pass filter circuit coupled between the sensor and the differentiating circuit, to militate against erroneous triggering of the differentiating circuit by stray noise pulses.

* * * * *